United States Patent
Choi et al.

(10) Patent No.: US 9,395,779 B2
(45) Date of Patent: Jul. 19, 2016

(54) SYSTEM INCLUDING MEMORY CONTROLLER FOR MANAGING POWER OF MEMORY

(71) Applicant: SK hynix Inc., Icheon-si Gyeonggi-do (KR)

(72) Inventors: Hoon Choi, Icheon-si (KR); Sang Don Lee, Icheon-si (KR); Yeon Uk Kim, Icheon-si (KR); Seok Joon Kang, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 216 days.

(21) Appl. No.: 14/243,663

(22) Filed: Apr. 2, 2014

(65) Prior Publication Data

US 2015/0153794 A1    Jun. 4, 2015

(30) Foreign Application Priority Data

Nov. 29, 2013   (KR) .................. 10-2013-0147750

(51) Int. Cl.
*G06F 1/26* (2006.01)
*G11C 5/14* (2006.01)
*G11C 16/30* (2006.01)

(52) U.S. Cl.
CPC .. *G06F 1/26* (2013.01); *G11C 5/14* (2013.01); *G11C 16/30* (2013.01)

(58) Field of Classification Search
CPC ............. G06F 1/26; G11C 5/14; G11C 16/30
See application file for complete search history.

(56) References Cited

U.S. PATENT DOCUMENTS

| | | | |
|---|---|---|---|
| 6,434,044 B1 * | 8/2002 | Gongwer | G11C 5/14 365/185.11 |
| 7,240,145 B2 | 7/2007 | Holman | |
| 7,453,741 B2 * | 11/2008 | Kim | G11C 5/147 327/540 |
| 2005/0141317 A1 * | 6/2005 | Kim | G11C 5/147 365/226 |
| 2010/0138684 A1 | 6/2010 | Kim et al. | |
| 2014/0133241 A1 * | 5/2014 | Shim | G11C 16/30 365/185.18 |

\* cited by examiner

*Primary Examiner* — Abdelmoniem Elamin
(74) *Attorney, Agent, or Firm* — William Park & Associates Ltd.

(57) ABSTRACT

A system includes a power supply, a memory controller and a memory device. The memory controller is configured to receive power from the power supply, generate a memory power supply voltage for use by the memory device based on the power received from the power supply and provide the memory power supply voltage to the memory device.

18 Claims, 5 Drawing Sheets

SYSTEM INCLUDING MEMORY CONTROLLER FOR MANAGING POWER OF MEMORY

CROSS-REFERENCES TO RELATED APPLICATION

The present application claims priority under 35 U.S.C. §119(a) to Korean application number 10-2013-0147750, filed on Nov. 29, 2013, in the Korean Intellectual Property Office, which is incorporated herein by reference in its entirety.

BACKGROUND

1. Technical Field

Various embodiments relate to a computer system, and more particularly, to a system including a memory controller and a memory device.

2. Related Art

A computer system may include a central processing unit, a memory, a graphic processing unit, a ROM, a storage unit, an input/output unit, and other components that support the operation of the computer system. The computer system may include a power supply configured to supply power to one or more of the components of the computer system and a power management circuit. The power management circuit may manage the power provided to the different components thereby managing the power generally consumed by the different components of the computer system.

FIG. 1 is a block diagram representation of a prior art system 10. The prior art system 10 may include a power supply 11, a memory controller 12, and a memory device 13. The power supply 11 may be configured to provide a controller power supply voltage VDDC to the memory controller 12, and a memory power supply voltage VDDM to the memory device 13. The memory controller 12 may be configured to perform one or more memory controller operations using the received power supply voltage VDDC. The memory device 13 may be configured to perform one or more memory device operations using the received power supply voltage VDDM.

The power supply 11 may include a power management integrated circuit. The power supply 11 and the power management integrated circuit may generate the controller power supply voltage VDDC and the memory power supply voltage VDDM in accordance with predefined universal standards, and provide the generated controller power supply voltage VDDC and the memory power supply voltage VDDM to the memory controller 12 and the memory device 13, respectively. The memory controller 12 and the memory device 13 may be manufactured by different manufacturers and may have different structures and different operational characteristics. In many cases, memory controllers and memory devices are being developed to accommodate increasing faster operation speeds while consuming relatively lower amounts of power. Training operations between the memory controller 12 and the memory devices 13 are often performed in an attempt to supply the memory controller 12 and the memory device 13 with appropriate power supply voltages. Manufactures often manufacture memory controllers 12 and memory devices 13 to operate over a relatively wide range of a power supply voltages

SUMMARY

In an embodiment, a system includes a power supply, a memory controller configured to receive power from the power supply, and a first memory device, wherein the memory controller generates a first memory power supply voltage for use by the first memory device based on the power received from the power supply, and provides the memory power supply voltage to the first memory device.

In an embodiment, a system includes a power supply, a memory controller configured to receive power from the power supply, at least one volatile memory device; and at least one nonvolatile memory device, wherein the memory controller generates a volatile memory power supply voltage for use by the volatile memory device and a nonvolatile memory power supply voltage for use by the nonvolatile memory device based on the power received from the power supply, and provides the volatile memory power supply voltage and the nonvolatile memory power supply voltage to the volatile memory device and the nonvolatile memory device, respectively.

DETAILED DESCRIPTION

A system including a memory controller configured to perform power management functions associated with one or more memory devices will be described below with reference to the accompanying drawings.

Figure 1:
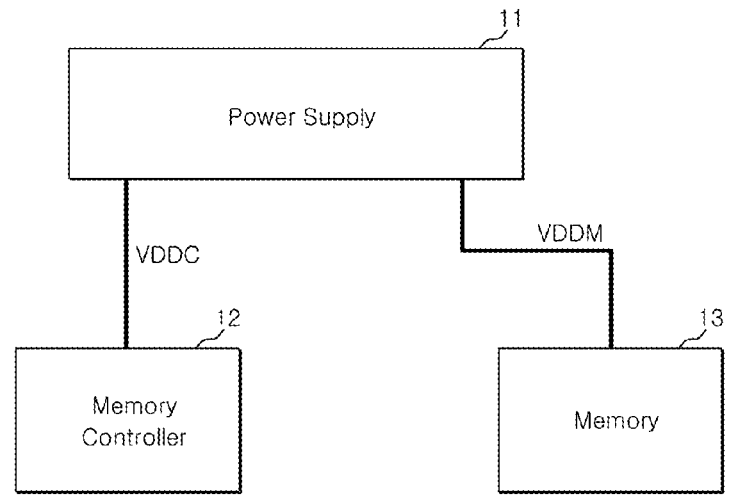
FIG. 1 is a block diagram representation of memory system including an embodiment of a power management block.
Figure 2:
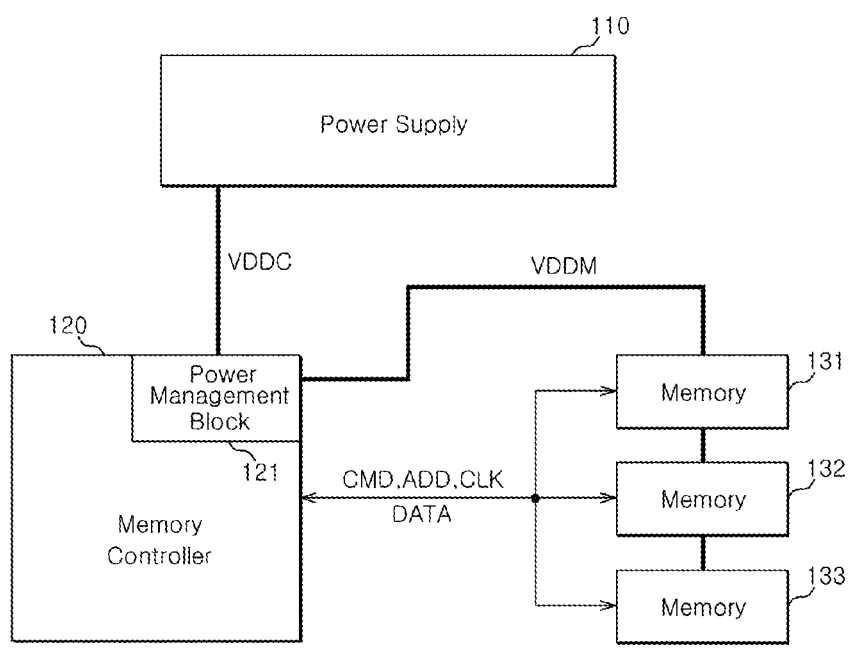
FIG. 2 is a block diagram representation of an embodiment of a system including a power management block.

In FIG. 2, an embodiment of the system 1 may include a power supply 110, a memory controller 120, and one or more memory devices 131, 132, 133. The power supply 110 may be configured to provide power to the memory controller 120. The power supply 110 may provide a controller power supply voltage VDDC to the memory controller 120.

The memory controller 120 may include one or more of a central processing unit (CPU), a graphic processing unit (GPU), a digital signal processor (DSP), at least one processor core, a single core processor, a dual core processor, a multiple core processor, a microprocessor, a host processor, a controller, a plurality of processors or controllers, a chip, a microchip, a logic circuit, an integrated circuit (IC), and an application-specific IC. The memory controller 120 may be configured to perform data communication operations associated with the one or more memory devices 131, 132, 133. The memory controller 120 may be configured to control operations of the memory devices 131, 132, 133 by being configured to provide a command signal CMD, an address signal ADD, a clock signal CLK and data DATA to the memory devices 131, 132, 133. The system 1 may include a plurality of buses for transmitting signals between the memory controller 120 and the memories 131, 132, 133. Examples of buses may include, but are not limited to, a command bus, an address bus, a clock bus, and a data bus.

The one or more memory devices 131, 132, 133 may be configured to store the data received from the memory controller 120 and transmit stored data to the memory controller 120 in response to commands received from the memory controller 120. In an embodiment, the one or more memory devices 131, 132, 133 may be the same kind of memory device. For example, the one or more memory devices 131, 132, 133 may be volatile memory devices, such as for example DRAM devices. While three memory devices 131, 132, 133 are shown in FIG. 2, the system 1 may include a greater or fewer number of memory devices.

In an embodiment, the system 1 is a memory system. The memory system may include a memory controller 120 and one or more memory devices 131, 132, 133. In an embodiment, the memory system may be a stacked chip package. In an embodiment, the memory system may be a flip chip package. In an embodiment, the memory system may be a system-in-package. In an embodiment, the memory system may be a package-on-package.

The memory controller 120 may be configured to receive the controller power supply voltage VDDC from the power supply 110. The memory controller 120 may be configured to receive power from the power supply 110 and generate a memory power supply voltage VDDM for use by one or more of the memory devices 131, 132, 133. The memory controller 120 may be configured to supply the memory power supply voltage VDDM to the one or more memory devices 131, 132, 133. The one or more memory devices 131, 132, 133 may be configured to receive the memory power supply voltage VDDM from the memory controller 120 and use the received power to perform one or more memory device operations.

The memory controller 120 may include a power management block 121. The power management block 121 may include information on the operational characteristics of one or more memory devices 131, 132, 133 that are electrically coupled with the memory controller 120. The power management block 121 may be configured to supply the memory power supply voltage VDDM to the memory devices 131, 132, 133, based on the information on the operational characteristics of one or more memory devices 131, 132, 133 stored at the power management block 121. Examples of the information on the operational characteristics may include, but is not limited to, operation voltage levels, processing skews and operation speeds of the memory devices 131, 132, 133. The information on the operation characteristics may include any standard or memory device specific information that facilitates communications between the one or more memory devices 131, 132, 133 and the memory controller 120. The power management block 121 receives the controller power supply voltage VDDC from the power supply 110, and generates the memory power supply voltage VDDM. In an embodiment, the memory controller 120 may include information on each of the one or more memory devices 131, 132, 133, and may provide each of the memory devices 131, 132, 133 with a memory power supply voltage that is specific to that memory device 131, 132, 133. For example different memory devices 131, 132, 133 may receive different levels of memory supply voltages VDDM, where the voltage level of the memory supply voltage VDDM received by a particular memory device 131, 132, 133 is specific to that memory device 131, 132, 133.

The system 1 includes a memory controller 120 that is configured to provide memory device specific memory supply voltages VDDM to each of the memory devices 131, 132, 133.

Figure 3:
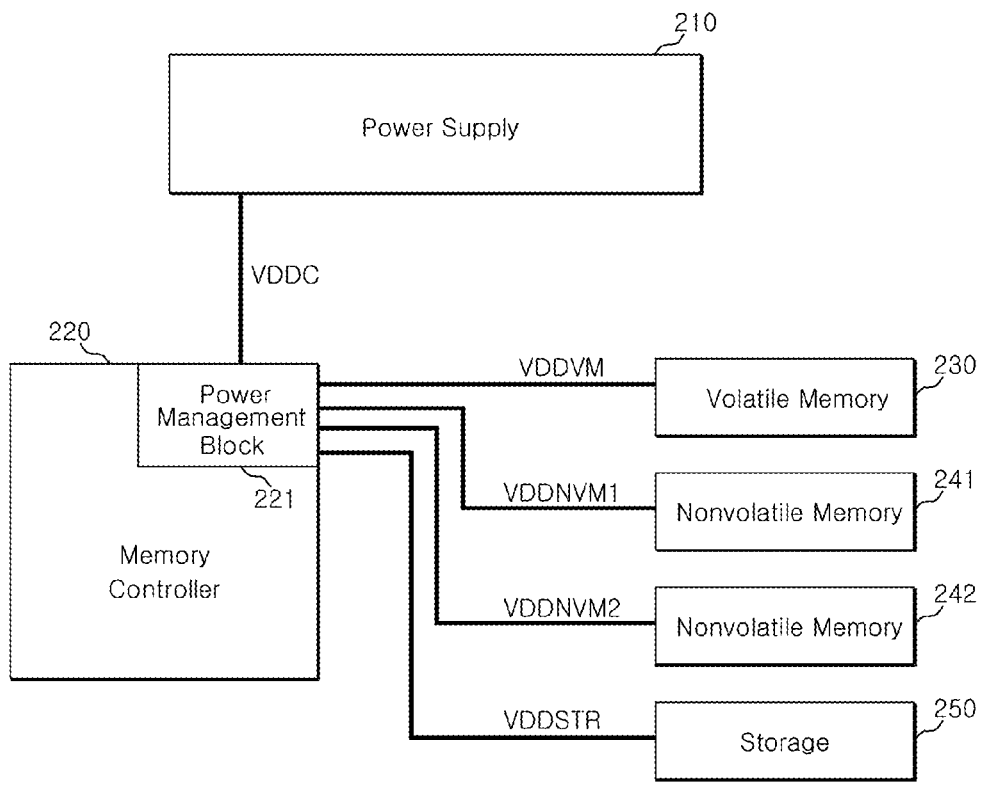
FIG. 3 is a block diagram representation of an embodiment of a system.

FIG. 3 is a block diagram representation of an embodiment of a memory system 2. The memory system 2 may include a power supply 210, a memory controller 220, at least one volatile memory device 230, and one or more nonvolatile memory devices 241, 242. An example of a volatile memory device 230 is a DRAM. Examples of nonvolatile memory devices 241 242 include, but are not limited to, a flash memory device, a PCRAM device, an ReRAM device, an FeRAM device, an MRAM device and an STTRAM device. The memory system 2 may include a command bus, an address bus, a clock bus and a data bus. The memory controller 220 may be configured to perform data communication operations with the one or more memory devices 230, 241, 242 via one or more of the command bus, address bus, clock bus and data bus. In an embodiment, the buses may be common buses that are electrically coupled to the one or more of the memory devices 230, 241, 242. In an embodiment, individual buses may be used to electrically couple each individual memory device 230, 241, 242 to the memory controller 220.

The memory system 2 includes two of more different kinds of memory devices. Each of the different kind of memory devices 230, 241, 242 is configured to use a power supply voltage having a different voltage level. The memory controller 220 may generate power supply voltages specific to the different kinds of memory devices 230, 241, 242, and provide the memory kind specific generated power supply voltages to the associated memory device 230, 241, 242. The memory controller 220 may include a power management block 221. The power management block 221 may be configured to include information on the operational characteristics of one or more memory devices 230, 241, 242 that are electrically coupled with the memory controller 220. The power management block 221 may generate power supply voltages specific to the different kinds of memory devices 230, 241, 242 based on the information on the operational characteristics of the different kinds of memory devices. The power management block 221 may generate a volatile memory power supply voltage VDDVM appropriate for use by the volatile memory device 230, and generate nonvolatile memory power supply voltages VDDNVM1, VDDNVM2 appropriate for use by the nonvolatile memory devices 241, 242. The volatile memory device 230 may operate using the received volatile memory power supply voltage VDDVM, and the nonvolatile memory devices 241, 242 may operate using the received nonvolatile memory power supply voltages VDDNVM1, VDDNVM2.

The system 2 in FIG. 3 may include a storage device 250. The storage device 250 may be configured to for storing a relatively large capacity of data. The storage device 250 may be electrically coupled with the memory controller 220 and at least one of the memory devices 230, 241, 242. Examples of storage devices 250 may include, but are not limited to, a disk type storage device and a card type storage device. Examples of disk type storage devices include, but are not limited to, a hard disk drive (HDD), a compact disc read only memory (CDROM), a digital versatile disc (DVD), and a solid state disk (SSD). Examples of card type storage devices include, but are not limited to, a universal serial bus memory (USB Memory), a secure digital (SD) card, a mini-secure digital (mSD) card, a micro secure digital (micro SD) card, a secure digital high capacity (SDHC) card, a memory stick card, a smart media (SM) card, a multimedia card (MMC), an embedded MMC (eMMC) and a compact flash (CF) card. The memory controller 220 may generate a storage power supply voltage VDDSTR appropriate for use by the storage device 250. In an embodiment, the memory controller 220 supplies the storage power supply voltage VDDSTR in addition to the voltages VDDVM, VDDNVM1 VDDNVM2 appropriate for use by the plurality of memory devices 230, 241, 242. The power management block 221 may include information on the operational characteristics of the storage is device 250, and may generate the storage power supply voltage VDDSTR based on the information.

Figure 4:
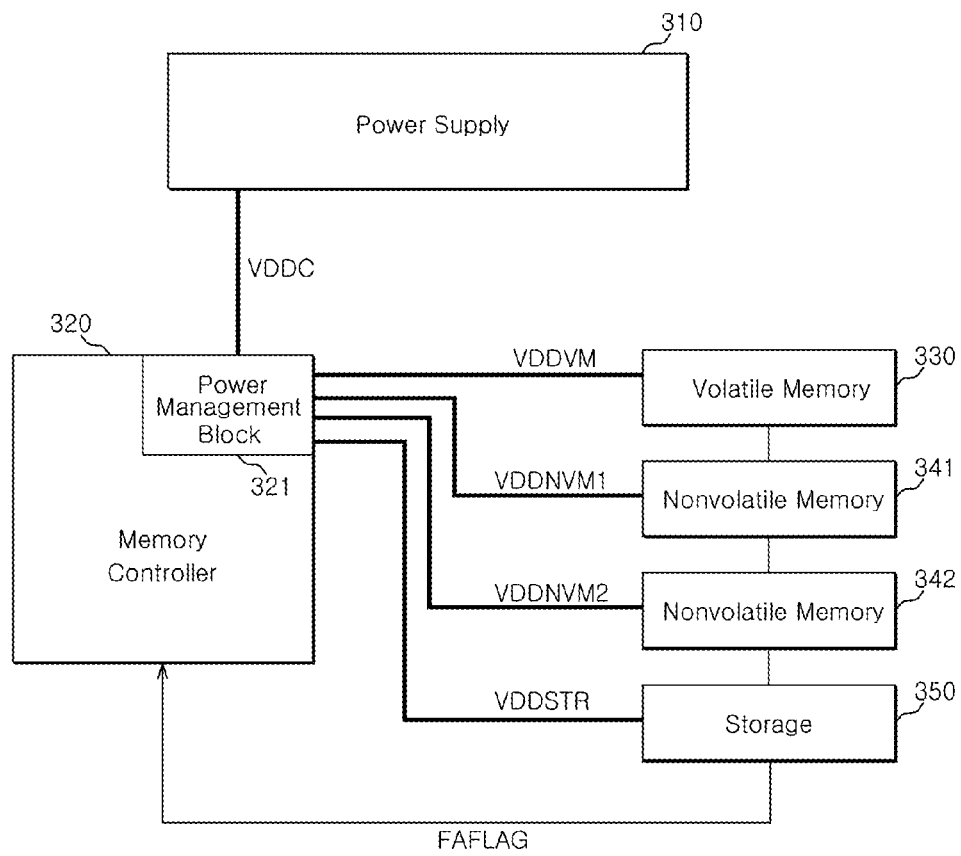
FIG. 4 is a block diagram representation of an embodiment of a system.

Referring to FIG. 4 a block diagram representation of an embodiment of a system 3 is shown. The system 3 may include a power supply 310, a memory controller 320, at least one volatile memory device 330, one or more nonvolatile memory devices 341, 342, and a storage device 350. The memory controller 320 may be configured to receive power from the power supply 310, and to generate a volatile memory power supply voltage VDDVM appropriate for use by the volatile memory device 330, nonvolatile memory power supply voltages VDDNVM1, VDDNVM2 appropriate for use by the nonvolatile memory devices 341, 342 and a storage power supply voltage VDDSTR appropriate for use by the storage device 350.

The volatile memory device 330, the nonvolatile memory devices 341, 342 and the storage device 350 may be configured to receive the corresponding power supply voltages VDDVM, VDDNVM1, VDDNVM2, and VDDSTR from the memory controller 320. The volatile memory device 330, the nonvolatile memory devices 341, 342 and the storage device 350 may be configured to generate a fail flag FAFLAG if the voltage level of a received power supply voltage VDDVM, VDDNVM1, VDDNVM2, VDDSTR is different from a target voltage level for that device. Information on the target voltage levels for each of the volatile memory device 330, the nonvolatile memory devices 341, 342 and the storage device 350 may be stored at that device. Each of the individual memory devices 330, 341, 342 and the is storage device 350 may be configured to compare the level of the power supply voltage VDDVM, VDDNVM1, VDDNVM2, VDDSTR received from the memory controller 320 with the target voltage level for the received power supply voltage VDDVM, VDDNVM1, VDDNVM2, VDDSTR, and may generate the fail flag FAFLAG when the level of the received power supply voltage VDDVM, VDDNVM1, VDDNVM2, VDDSTR is different from the target voltage level for that device. The fail flag FAFLAG may have information regarding whether the received power supply voltage VDDVM, VDDNVM1, VDDNVM2 and VDDSTR is relatively higher than or relatively lower than the target voltage level. The memory devices 330, 341, 342 and the storage device 350 may not generate the fail flag FAFLAG when the level of the power supply voltage VDDVM, VDDNVM1, VDDNVM2, VDDSTR received at the device is substantially the same as the target voltage level for that device.

The memory controller 320 may include a power management block 321 configured to generate the power supply voltages VDDVM, VDDNVM1, VDDNVM2, VDDSTR. The power management block 321 may include information on the operational characteristics of the volatile memory device 330, the nonvolatile memory devices 341, 342 and the storage device 350. The power management block 321 may be configured to generate the volatile memory power supply voltage VDDVM, the nonvolatile memory power supply voltages VDDNVM1, VDDNVM2 and the storage power supply voltage VDDSTR based on the information on the operational characteristics of the devices. If one of the volatile memory device 330, the nonvolatile memory devices 341, 342 and the storage device 350 generates a fail flag FAFLAG, the power management block 321 may receive the fail flag FAFLAG and may responsively adjust the voltage level of the power supply voltage VDDVM, VDDNVM1, VDDNVM2, VDDSTR associated with the device that generated the fail flag FAFLAG.

Figure 5:
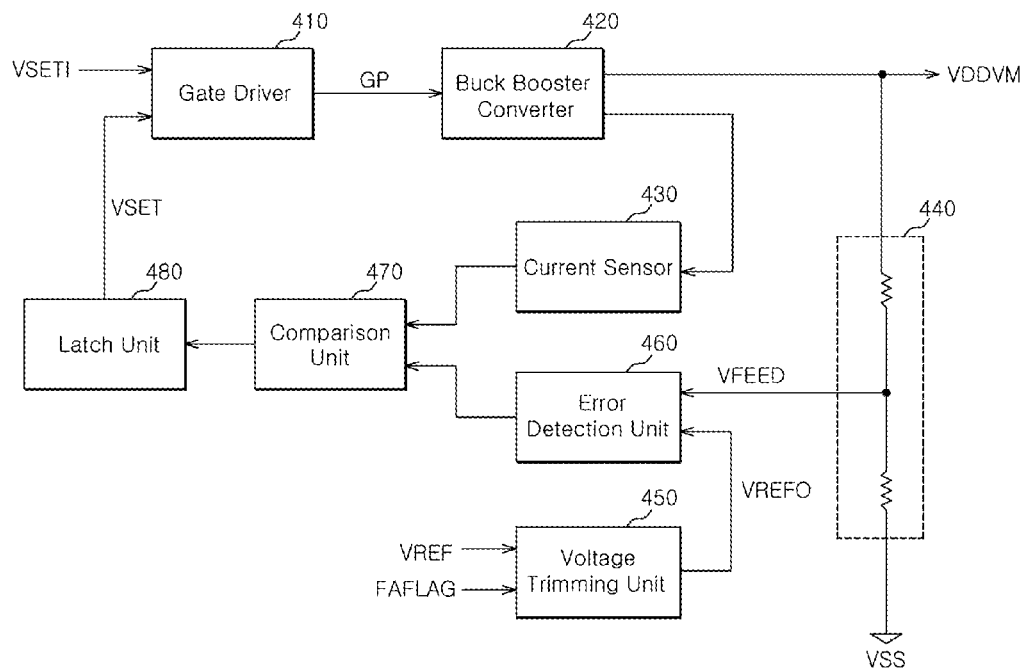
FIG. 5 is a block diagram representation of an embodiment of a power management block.

FIG. 5 is a block diagram representation of an embodiment of the power management block 321. In particular, FIG. 5 shows the components of the power management block 321 used to generate the volatile memory power supply voltage VDDVM. The power management block 321 may include a gate driver 410, a buck booster converter 420, a current sensor 430, a voltage division unit 440, a voltage trimming unit 450, an error detection unit 460, a comparison unit 470, and a latch unit 480.

The gate driver 410 may generate a gate pulse GP to control the voltage level of the volatile memory power supply voltage VDDVM that is output by the buck booster converter 420. The gate driver 410 may control the pulse of the gate pulse GP. The gate driver 410 may generate the gate pulse GP in response to an initial setting signal VSETI when the memory controller 320 receives the controller power supply voltage VDDC from the power supply 310. The initial setting signal VSETI may be generated based on information on the operational characteristic of the volatile memory device 330. The gate driver 410 may increase or decrease the pulse width of the gate pulse GP in response to a power supply voltage setting signal VSET.

The buck booster converter 420 may generate the volatile memory power supply voltage VDDVM in response to the gate pulse GP received from the gate driver 410. For example, the buck booster converter 420 may generate the volatile memory power supply voltage VDDVM having a relatively higher voltage level when the pulse width of the gate pulse GP increases, and may generate the volatile memory power supply voltage VDDVM having a relatively lower voltage level when the pulse width of the gate pulse GP decreases.

The current sensor 430 may sense an amount of current used by the buck booster converter 420, and may responsively generate a periodic signal having the shape of a triangular wave. The voltage division unit 440 may divide the volatile memory power supply voltage VDDVM and generate a feedback voltage VFEED.

If the volatile memory device 330 generates a fail flag FAFLAG, the voltage trimming unit 450 may receive the fail flag FAFLAG from the volatile memory device 330. The voltage trimming unit 450 may generate a corrected reference voltage VREFO by raising or lowering the level of a reference voltage VREF in response to the fail flag FAFLAG. The error detection unit 460 may compare the level of the feedback voltage VFEED with the level of the corrected reference voltage VREFO.

The comparison unit 470 may determine a voltage level difference between the feedback voltage VFEED and the corrected reference voltage VREFO based on the output of the current sensor 430 and the output of the error detection unit 460. The latch unit 480 may latch the result of the comparison generated by the comparison unit 470 and generate the power supply voltage setting signal VSET.

The power management block 321 may include a power management integrated circuit. In an embodiment of such a power management block 321 may perform the additional function of generating the volatile memory power supply voltage VDDVM based on the information on the operational characteristic of the volatile memory device 330 and of adjusting the voltage level of the volatile memory power supply voltage VDDVM based on a comparison of the level of the reference voltage VREF with the feedback voltage VFFED and on the fail flag FAFLAG received from the volatile memory device 330.

Figure 6:
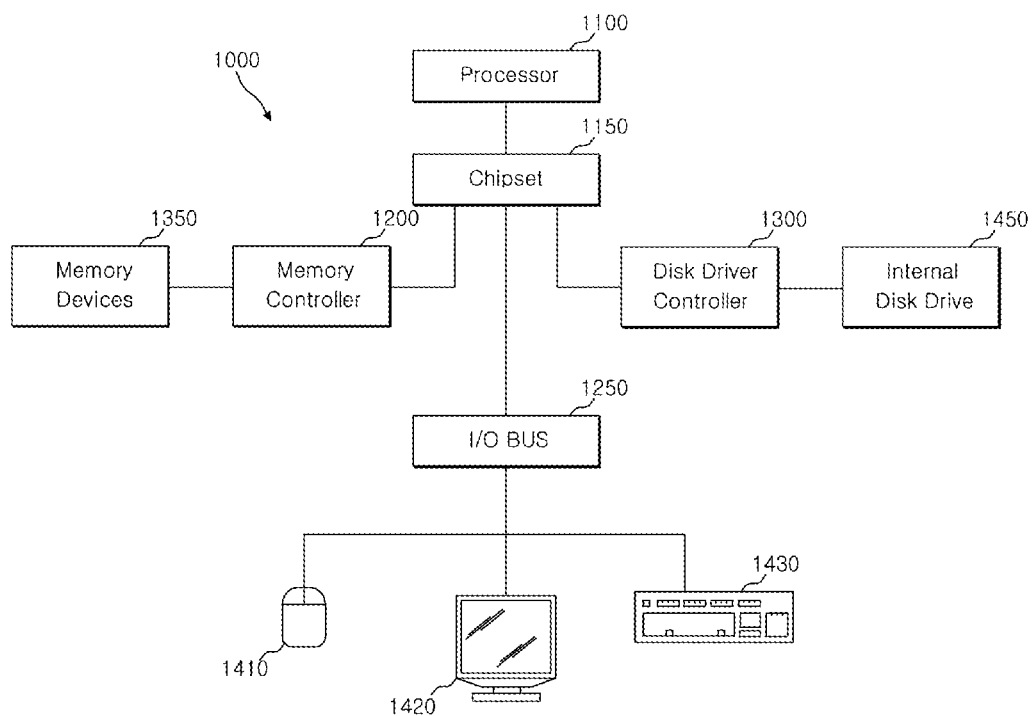
FIG. 6 is a block diagram representation of an embodiment of a system including an embodiment of the power management block.

Referring to FIG. 6, a block diagram representation of a system 1000 including an embodiment of a memory system is shown. The system 1000 includes one or more semiconductor memory devices 1350 and a memory controller 1200. In an embodiment, the memory system includes a memory controller 1200, a power supply and at least one semiconductor memory device 1350. In an embodiment, the memory controller 1200 includes a power management block. In an embodiment, the power management block is the power management block of FIG. 2. In an embodiment, the power management block is the power management block of FIG. 3. In a embodiment, the power management block is the power management block of FIG. 4. In an embodiment, the power management block is the power management block of FIG. 5.

In an embodiment, the system includes a power supply, a memory controller 1200 and a semiconductor memory device 1350. The memory controller 1200 is configured to receive power from the power supply, generate a memory power supply voltage for use by the semiconductor memory device 1350 based on the power received from the power supply and provide the memory power supply voltage to the semiconductor memory device 1350.

Examples of the semiconductor memory device 1350 include, but are not limited to, volatile memory, nonvolatile memory, dynamic random access memory, static random access memory, synchronous dynamic random access memory (SDRAM), synchronous graphics random access memory (SGRAM), double data rate dynamic ram (DDR), and double data rate SDRAM.

The memory controller 1200 is used in the design of memory devices, processors, and computer systems. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented A chipset 1150 may be electrically coupled to the CPU 1100. The chipset 1150 is a communication pathway for signals between the CPU 1100 and other components of the system 1000, which may include the memory controller 1200, an input/output ("I/O") bus 1250, and a disk drive controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be electrically coupled to the chipset 1150. The memory controller 1200 can receive a request provided from the CPU 1100, through the chipset 1150. In alternate embodiments, the memory controller 1200 may be integrated into the chipset 1150. The memory controller 1200 may be electrically coupled to one or more memory devices 1350. The memory devices 1350 may be any one of a number of industry standard memory types, including but not limited to, single inline memory modules ("SIMMs") and dual inline memory modules ("DIMMs"). Further, the memory devices 1350 may facilitate the safe to removal of the external data storage devices by storing both instructions and data.

The chipset 1150 may be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 may also be electrically coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

The system 1000 described above in relation to FIG. 6 is merely one example of a system employing a semiconductor memory device 1350. In alternate embodiments, such as cellular phones or digital cameras, the components may differ from the embodiment shown in FIG. 6.

While certain embodiments have been described above, it will be understood to those skilled in the art that the embodiments described are by way of example only. Accordingly, the system including a memory controller for managing power of a memory described herein should not be limited based on the described embodiments. Rather, the system including a memory controller for managing power of a memory described herein should only be limited in light of the claims that follow when taken in conjunction with the above description and accompanying drawings.

What is claimed is:

1. A system comprising:
a power supply;
a memory controller configured to receive power from the power supply; and
a first memory device,
wherein the memory controller is configured to generate a first memory power supply voltage for use by the first memory device based on the power received from the power supply, and provide the first memory power supply voltage to the first memory device,
wherein the first memory device is configured to transmit a fail flag to the memory controller when the first memory power supply voltage received at the first memory device is different from a target voltage level.

2. The system according to claim 1, wherein the memory controller generates the first memory power supply voltage based on information on one or more operational characteristics of the first memory device.

3. The system according to claim 1, wherein the memory controller and the first memory device are components of a memory system, and the memory system is selected from a group consisting of a stacked chip package, a flip chip package, a system-in-package and a package-on-package.

4. The system according to claim 1, further comprising a second memory device, wherein the memory controller is configured to generate a second memory power supply voltage for the second memory device based on the power received from the power supply, and provide the second memory power supply voltage to the second memory device.

5. The system according to claim 4, wherein the first memory device is the same kind of memory device as the second memory device.

6. The system according to claim 4, wherein the first memory device and the second memory device are different kinds of memory devices.

7. The system according to claim 4, wherein the first memory device is a volatile memory device and the second memory device is a non-volatile memory device.

8. The system according to claim 1, wherein the memory controller is configured to adjust a level of the first memory power supply voltage supplied to the first memory device in response to the fail flag.

9. The system according to claim 1, further comprising a storage device, wherein the memory controller is configured to generate a storage power supply voltage for the storage device based on the power received from the power supply, and provide the storage power supply voltage to the storage device.

10. The system according to claim 9, wherein the storage device is configured to transmit the fail flag to the memory controller when the storage power supply voltage received at the storage device is different from a target voltage level.

11. The system according to claim 10, wherein the memory controller is configured to adjust a level of the storage power supply voltage supplied to the storage device in response to the fail flag.

12. A system comprising:
a power supply;
a memory controller configured to receive power from the power supply;
at least one volatile memory device; and
at least one nonvolatile memory device,
wherein the memory controller is configured to generate a volatile memory power supply voltage for use by the volatile memory device and a nonvolatile memory power supply voltage for use by the nonvolatile memory device based on the power received from the power supply, and provide the volatile memory power supply voltage and the nonvolatile memory power supply voltage to the volatile memory device and the nonvolatile memory device, respectively,
wherein each of the volatile memory device and the nonvolatile memory device is configured to transmit a fail flag to the memory controller when a level of the power supply voltage supplied to the memory device is different from a target voltage level associated with that memory device.

13. The system according to claim 12, wherein the memory controller generates the volatile memory power supply voltage and the nonvolatile memory power supply voltage based on information on one or more operational characteristics of the volatile memory device and of the nonvolatile memory device.

14. The system according to claim 12, wherein the memory controller, volatile memory device and the nonvolatile memory device are components of a memory system, and the memory system is selected from a group consisting of a stacked chip package, a flip chip package, a system-in-package and a package-on-package.

15. The system according to claim 12, wherein the memory controller is configured to adjust the level of the power supply voltage supplied to the memory device that generated the fail flag in response to the fail flag.

16. The system according to claim 12, further comprising:
a storage device electrically coupled with the memory controller and configured to store a large capacity of data.

17. The system according to claim 16, wherein the memory controller is configured to generate a storage power supply voltage for use by the storage device based on the power received from the power supply and provide the storage power supply voltage to the storage device.

18. The system according to claim 17, wherein the memory controller comprises a power management block configured to generate the storage power supply voltage based on information on one or more operational characteristic of the storage device.

* * * * *